United States Patent

Hongu et al.

[11] 4,005,371
[45] Jan. 25, 1977

[54] BIAS CIRCUIT FOR DIFFERENTIAL AMPLIFIER

[75] Inventors: Masayuki Hongu, Komae; Masahiro Tada, Tokyo, both of Japan

[73] Assignee: Sony Corporation, Tokyo, Japan

[22] Filed: July 1, 1975

[21] Appl. No.: 592,215

[30] Foreign Application Priority Data
July 19, 1974   Japan .............................. 49-83069

[52] U.S. Cl. ............................... 330/30 D; 330/22; 330/32; 330/40
[51] Int. Cl.² ...................................... H03F 3/45
[58] Field of Search ............. 330/22, 30 D, 69, 32, 330/40

[56] References Cited
UNITED STATES PATENTS
3,781,699   12/1973   Sakamoto .................. 330/30 D Primary Examiner—R. V. Rolinec
Assistant Examiner—Lawrence J. Dahl
Attorney, Agent, or Firm—Lewis H. Eslinger; Alvin Sinderbrand

[57] ABSTRACT

A separate emitter follower type bias circuit is connected to each base electrode of a transistorized differential amplifier which handles unbalanced input signals. A series circuit of resistors is employed for supplying a suitable bias voltage common to both emitter follower type bias circuits.

5 Claims, 4 Drawing Figures

BIAS CIRCUIT FOR DIFFERENTIAL AMPLIFIER

BACKGROUND OF THE INVENTION

1. Field of the Invention

The present invention relates generally to a bias circuit, and more particularly to a bias circuit for a differential amplifier of the type of a single drive.

2. The Prior Art

In some differential amplifiers having single-ended input circuits, the base bias voltage is derived from an emitter-follower connected to the bases of both of the differentially connected transistors. Although the base of the differentially connected transistor to which the input signal is not applied could be connected to a low impedance supply circuit, the other differentially connected transistor, to which the input signal is applied, must have a relatively high impedance base circuit so as not to attenuate the input signal. The relatively high impedance circuit requires that there be a resistor between the base of the signal input transistor and the emitter of the emitter-follower circuit that supplies the base bias voltage. Base current flowing through that resistor affects the bias voltage at the base.

Balanced operation of the two differentially connected transistors requires that the other of the two transistors also have a resistor between its base and the emitter of the emitter-follower circuit. In order to hold the base of the second differentially connected transistor substantially at ground level, a capacitor may be connected between that base and ground. However, this is not satisfactory for integrated circuit use because of the necessity to provide a connection for the capacitor. Furthermore, it affects the low frequency response of the differential amplifier.

Balancing resistors may be inserted in the emitter leads of the differentially connected transistors instead of connecting the base of the second transistor to ground through a capacitor. However, these balancing resistors reduce the gain that may be obtained from the differential amplifier.

SUMMARY OF THE INVENTION

It is one of the objects of the present invention to provide an improved emitter-follower bias circuit for a differential amplifier handling unbalanced input signals, or a differential amplifier having a single-ended input circuit.

Other objects and advantages of the invention will become apparent from the following description taken in conjunction with the accompanying drawings.

In accordance with the present invention separate emitter-follower bias circuits are connected to the base electrodes of the transistors of a differential amplifier. The separate emitter-follower circuits have bias circuits of their own that equalize the base bias voltage applied to the differential amplifier transistors by way of the emitter-follower circuits.

DETAILED DESCRIPTION OF THE INVENTION

Figure 1:
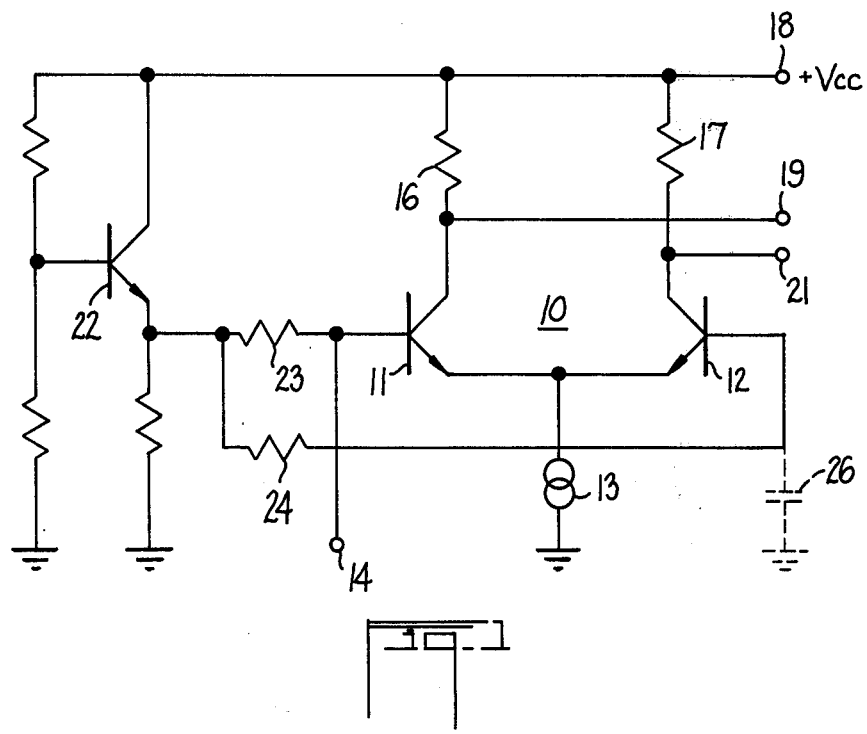
FIGS. 1 and 2 are schematic diagrams showing differential amplifiers with common emitter follower base bias circuits.

A differential amplifier 10 having an unbalanced input is shown in FIG. 1. In this circuit the emitter electrodes of a pair of transistors 11 and 12 are connected directly together to a common constant current source 13. The base electrode of the transistor 11 is connected to an input terminal 14, the collector electrodes of the transistors 11 and 12 are connected through their respective load resistors 16 and 17 to a power supply terminal 18 having a voltage $+V_{cc}$. Two output terminals 19 and 21 are connected to the collector electrodes of the transistors 11 and 12, respectively. A transistor 22 connected in an emitter follower circuit provides base bias voltage for the differential amplifier 10. The emitter of the transistor 22 is connected by resistors 23 and 24 to the base electrodes of the transistors 11 and 12 to apply the emitter voltage of the transistor 22 as base bias voltage to the transistors 11 and 12 respectively.

In this circuit, if the resistor 23 is not provided but, instead, the base of the transistor 11 is connected directly to the emitter of the transistor 22, an input signal from the input terminal 14 will be by-passed through the emitter electrode of the transistor 22, which forms a low impedance path, and hence the practical voltage gain of the amplifier 10 will be lowered. To avoid this, the resistor 23 is provided, but base current of the transistor 11 flowing through the resistor 23 causes a voltage drop. As a result, the base voltage of the transistor 11 is lowered by that voltage drop.

In order to keep the operating conditions of the transistors 11 and 12 equal, the base voltage of the transistor 12 is reduced by connecting the resistor 24 in series between the emitter of the transistor 22 and the base of the transistor 12. For this reason, in general, the resistors 23 and 24 are selected equal in resistance value.

Since the resistor 23 is provided to avoid reduction of the input signal at the input terminal 14, and since the transistor 11 is connected differentially and its input impedance is rather high, the resistor 23 is required to have a high resistance value. If the resistance value of the resistor 23 is selected to be high, the resistance value of the resistor 24 must be made high, also, corresponding to the resistor 23. However, if the resistance value of the resistor 24 is high, the equivalent base resistance of the transistor 12 becomes high. As a result, the amplifier 10 cannot operate as an ideal differential amplifier. Since the differential amplifier 10 has a single-ended input, the base of the transistor 12 must be operated at AC ground. However, as the resistance value of the resistor 24 becomes higher, the base electrode of the transistor 12 becomes farther removed from AC ground. As a result, input signal components appear at the base electrode of the transistor 12 in phase with signals at the base electrode of the transistor 11, which reduces the voltage gain of the amplifier 10.

To avoid this, even when the resistance values of the resistors 23 and 24 are high, and the base electrode of the transistor 12 may be by-passed to ground through a capacitor 26 shown in FIG. 1 in dotted lines. However, such a capacitor 26 is not preferred if the circuit is formed as an integrated circuit.

Figure 2:
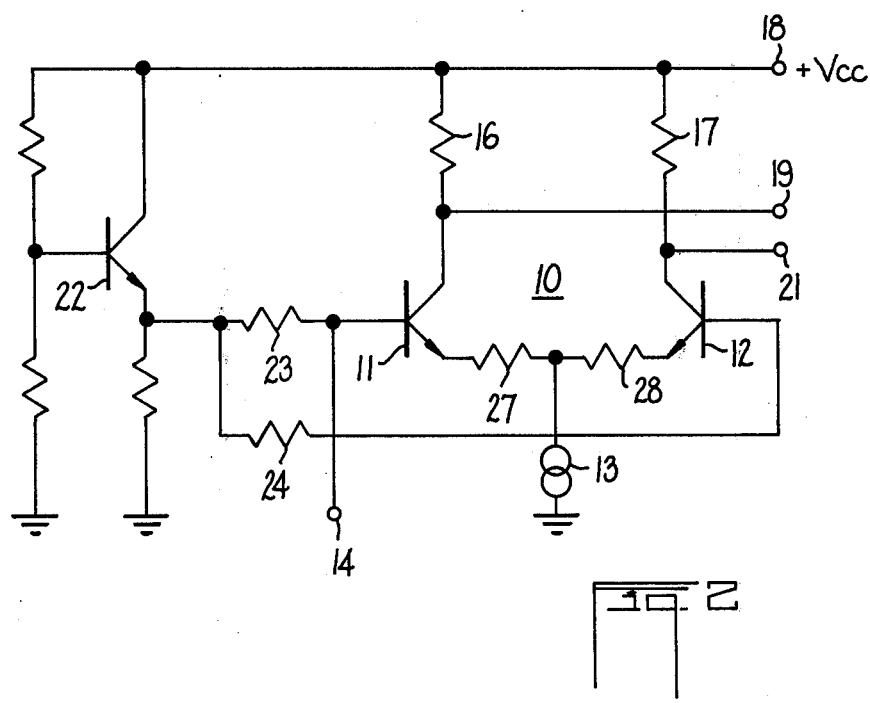

Therefore, when the differential amplifier 10 shown in FIG. 1 is made as an integrated circuit, the resistance value of the resistor 23 is made great, that of the resistor 24 is made small, and resistors 27 and 28 are connected between the emitter electrodes of the transistor 11 and 12 and the constant current source 13, respectively, as shown in FIG. 2 in which reference numerals which are the same as those used in FIG. 1 show the same elements. In this case, if it is merely selected that the resistance value of the resistor 23 is great while that of the resistor 24 is small, the base voltage of the transistor 11 becomes different from that of the transistor 12, and accordingly an offset voltage is produced at the output terminals 19 and 21. Thus, when the difference voltage between the base voltages of the transistors 11 and 12 becomes more than several ten millivolts (mV), the differential amplifier 10 shown in FIG. 1 is not a linear amplifier and tends to operate in a current switch mode. To avoid this defect, when the resistors 23 and 24 differ in resistance value, the resistors 27 and 28 are provided, as shown in FIG. 2, so as to prevent the occurrence of the offset voltage at the terminals 19 and 21 and to operate the differential amplifier 10 as a linear amplifier.

However, with the circuit shown in FIG. 2 in which the resistors 27 and 28 are provided, if it is assumed that the resistance value of the resistors 27 and 28 is taken as $R_E$ and that of the resistors 16 and 17 as $R_L$, the voltage gain of the differential amplifier 10 shown in FIG. 2 is expressed as $R_L/R_E$. When the circuit shown in FIG. 2 is formed as an integrated circuit, the resistance value $R_L$ of the resistors 16 and 17 is restricted and hence the voltage gain is restricted. As a result, a great voltage gain cannot be obtained.

An embodiment of the present invention will be now described with reference to FIG. 3 in which the elements corresponding to those used in FIGS. 1 and 2 are identified by corresponding reference numerals.

Figure 3:
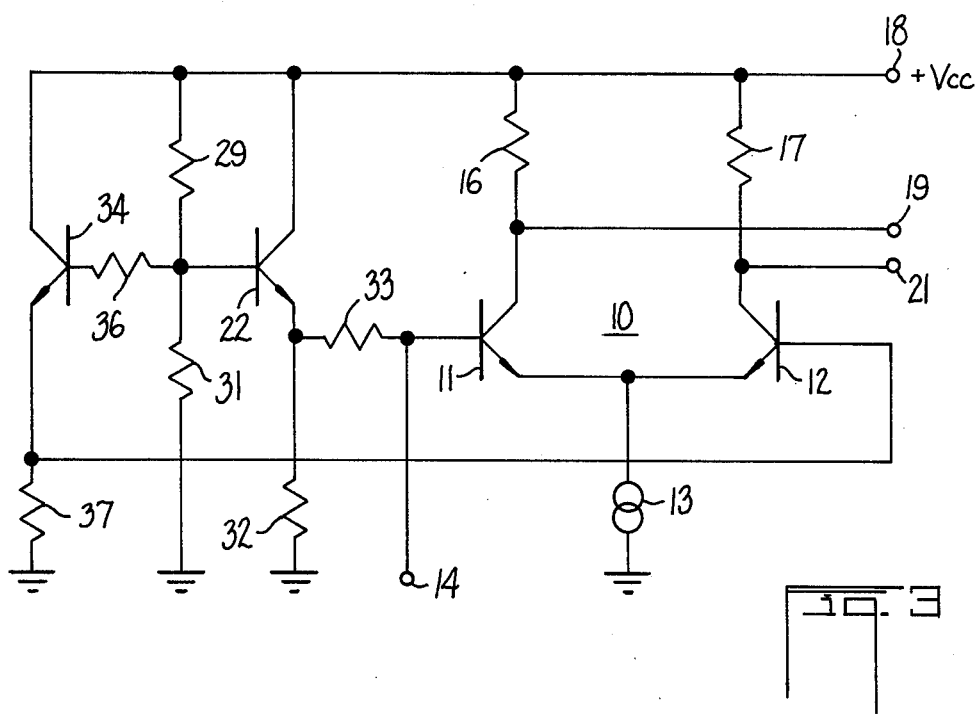
FIGS. 3 and 4 are schematic diagrams showing embodiments of differential amplifier circuits with separate emitter follower base bias circuits according to the present invention.

In the embodiment of FIG. 3, resistors 29 and 31 are connected in series between the voltage source terminal 18 to which a voltage of $+V_{cc}$ is supplied and the ground. The connection point between the resistors 29 and 31 is connected to the base electrode of the transistor 22 to supply a bias voltage to the same. The collector electrode of the transistor 22 is connected to the voltage source terminal 18, and its emitter electrode is grounded through a resistor 32. Thus, the transistor 22 is connected in an emitter follower configuration. The emitter electrode of the transistor 22 is further connected through a resistor 33 to the base electrode of the transistor 11 to supply the emitter voltage of the former to the base electrode of the latter as a bias voltage thereof.

In this invention, as shown in FIG. 3, there is further provided a transistor 34 whose base electrode is connected through a resistor 36 to the connection point between the resistors 29 and 31 or to the base electrode of the transistor 22, the collector electrode of the transistor 34 is connected to the voltage source terminal 18, and its emitter electrode is grounded through a resistor 37 to make the transistor 34 as an emitter follower configuration. The emitter electrode of the transistor 34 is connected further to the base electrode of the transistor 12 to supply the emitter voltage of the former to the base electrode of the latter as its bias voltage.

With the circuit construction described above with reference to FIG. 3, if it is assumed that $V_{BE22}$ and $V_{BE34}$ represent the base-emitter voltages of the transistors 22 and 34, respectively;

$V_{BB}$ represents the base voltage of the transistor 22;

$\beta_{11}$ and $\beta_{34}$ represent the current amplification factors of the transistors 11 and 34, respectively;

$I_{E34}$ represents the emitter current of the transistor 34;

$I_0$ represents the constant current from the constant current source; and $R_{33}$ and $R_{36}$ represent the resistance values of the resistors 33 and 36, respectively, the base voltages $V_{B11}$ and $V_{B12}$ of the transistors 11 and 12 can be expressed as follows:

$$V_{B11} = V_{BB} - V_{BE22} - R_{33}\frac{I_{0/2}}{1+\beta_{11}}$$

$$V_{B12} = V_{BB} - R_{36}\frac{I_{E34}}{1+\beta_{34}} - V_{BE34}$$

If it is assumed that $V_{B11} = V_{B12}$, the following equation is obtained:

$$V_{BE22} + R_{33}\frac{I_{0/2}}{1+\beta_{11}} = R_{36}\frac{I_{E34}}{1+\beta_{34}} + V_{BE34}$$

where, if $V_{BE22} = V_{BE34}$ and $\beta_{11} = \beta_{34}$ are assumed in the above equation, this equation can be expressed as follows:

$(R_{33} \cdot I_0)/2 = R_{36}I_{E34}$ $R_{33} \cdot I_0 = 2R_{36} \cdot I_{E34}$ $R_{33}/R_{36} = 2I_{E34}/I_0$ \hfill (1)

Accordingly, if the values of the elements concerning the equation (1) are selected to satisfy the equation (1), $V_{B11} = V_{B12}$ is obtained. Thus, even if the resistors 27 and 28 used in the circuit shown in FIG. 2 are not provided in the embodiment of the invention shown in FIG. 3, in the invention there is no fear that any offset voltage is produced at the terminals 19 and 21 and the differential amplifier 10 of the invention operates as a linear amplifier. In the invention since the resistance value $R_{33}$ of the resistor 33 can be made great, the input signal applied to the input terminal 14 is not by-passed through the emitter electrode of the transistor 22. The base electrode of the transistor 12 is by-passed through the emitter electrode of the transistor 34. Further, since the resistors 27 and 28 used in the prior art are not used in this invention described as above, the voltage gain of this invention can be much increased.

As described above, with the differential amplifier according to the present invention, no offset voltage is produced at the terminals 19 and 21 and the voltage gain of the differential amplifier 10 with the circuit of the invention can be made great. Further, the circuit of the invention readily can be formed as an integral circuit.

In the embodiment of the invention shown in FIG. 3, only the transistor 11 is connected to the input terminal 14, but it may be possible to connect further transistors to the input terminal 14.

Figure 4:
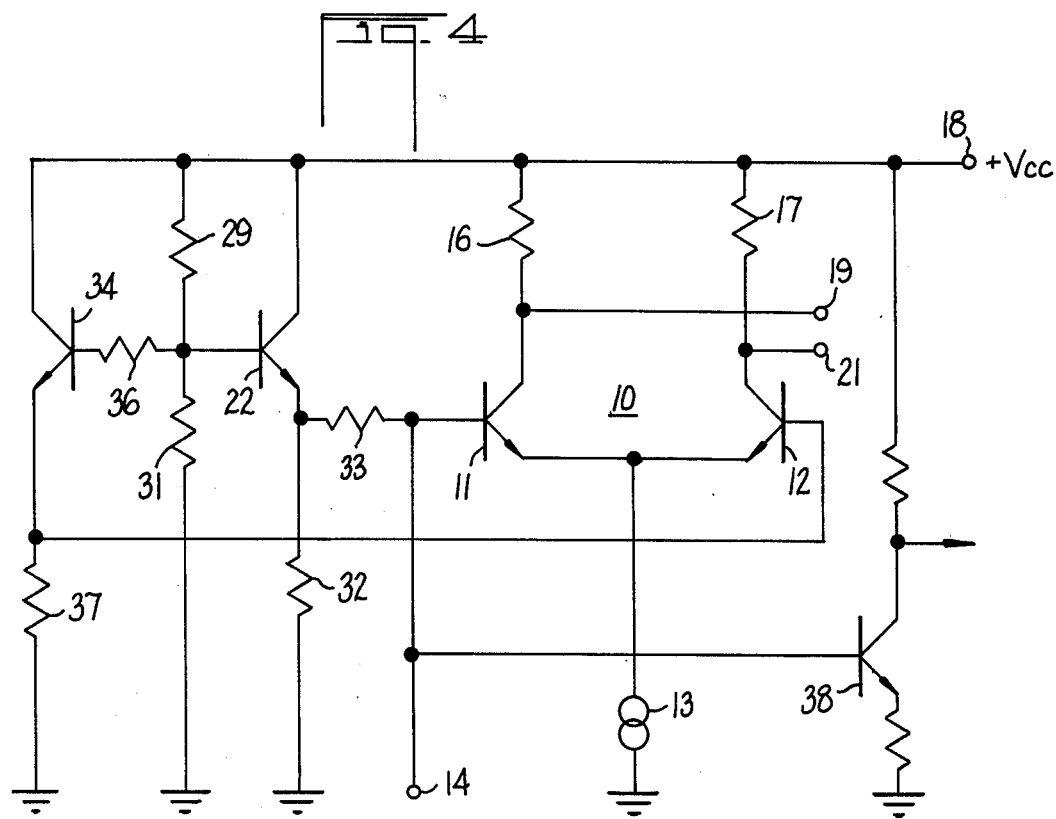

FIG. 4 shows another embodiment of the invention in which the base of another transistor 38 is provided in connection with the input terminal 14. The base electrode of the transistor 38 is also connected to the input terminal 14, its collector electrode is connected to the voltage source terminal 18 and its emitter electrode is grounded. The remainder of the circuit in FIG. 4 is substantially the same as that of FIG. 3, but, because of the fact that the input circuit of the transistor 38 is connected in parallel with the input circuit of the transistor 11, the base currents of both transistors 11 and 38 will flow through the resistor 33. This makes it necessary to determine the resistance values somewhat differently than in the circuit in FIG. 3.

Assuming that the emitter current of the transistor 38 is $I_{E38}$ and that the current amplification factor of the transistor 38 is $\beta_{38}$ and that all of the other factors are as defined previously, the base bias voltage $V_{B11}$ on the transistor is now given by the equation:

$$V_{B11} = V_{BB} - V_{BE22} - R_{33}\left(\frac{I_{0/2}}{1+\beta_{11}} + \frac{I_{E38}}{1+\beta_{38}}\right).$$

As before, $V_{B11}$ must be equal to $V_{B12}$, which is still:

$$V_{B12} = V_{BB} - R_{36}\frac{I_{34}}{1+\beta_{34}} - V_{BE34}$$

Assuming that the $\beta$'s of the transistors 11, 34 and 38 are substantially equal and that the base-emitter voltages of the transistors 22 and 34 are substantially equal, the following equation is obtained by setting $V_{B11} = V_{B12}$: or $$R_{33}\left(\frac{I_0}{2} + I_{38}\right) = R_{36}I_{E34}$$

or $$\frac{R_{33}}{R_{36}} = \frac{2I_{E34}}{I_0 + 2I_{E38}}.$$

It will be apparent that many modifications and variations could be effected by one skilled in the art without departing from the spirit or scope of the novel concepts of the present invention.

What is claimed is:

1. A circuit comprising:
   A. a differential amplifier comprising first and second differentially connected transistors, each having an input electrode, said input electrode of said first transistor comprising a signal input terminal for said differential amplifier;
   B. a first emitter-follower bias circuit and first resistance means connecting said bias circuit to said input electrode of said first transistor;
   C. a second emitter-follower bias circuit connected to said input electrode of said second transistor;
   D. first means for supplying a first predetermined bias voltage to a base circuit of said first emitter-follower bias circuit;
   E. second means comprising second resistance means for supplying a second predetermined bias voltage to a base circuit of said second emitter-follower bias circuit; and
   F. means for deriving an output terminal from said differential amplifier.

2. A circuit as cited in claim 1, wherein said first and second predetermined bias voltage supply means respectively comprise a pair of series-connected resistors connected between a power source terminal and a reference potential terminal, said first resistance means comprising a third resistor connected in series between the base of said first emitter follower bias circuit and a common circuit point between said pair of resistors.

3. A circuit comprising:
   A. an input terminal;
   B. differential amplifier including first and second base input electrodes;
   C. means for connecting said input terminal to said first input electrode of the differential amplifier;
   D. a first emitter-follower bias circuit comprising a first resistor connecting said bias circuit to said first input electrode of the differential amplifier;
   E. a second emitter-follower bias circuit connected to said second input electrode of the differential amplifier;
   F. first means for supplying a predetermined bias voltage to a base circuit of said first emitter-follower type bias circuit;
   G. second means comprising a second resistor for supplying said predetermined bias voltage to a base circuit of said second emitter-follower bias circuit; and
   H. means for deriving an output terminal from said differential amplifier.

4. A circuit as cited in claim 3, wherein said differential amplifier comprises a pair of transistors and a common current source connecting both emitter electrodes of said transistors to a reference potential terminal.

5. A circuit as cited in claim 3, wherein said predetermined bias voltage is generated by series-connected resistors which are connected between a power source terminal and a reference potential terminal.

* * * * *